(12) United States Patent
Chiu et al.

(10) Patent No.: US 10,115,843 B2
(45) Date of Patent: Oct. 30, 2018

(54) BROADBAND ANTIREFLECTION COATINGS UNDER COVERGLASS USING ION GUN ASSISTED EVAPORATION

(71) Applicant: THE BOEING COMPANY, Chicago, IL (US)

(72) Inventors: Philip Chiu, Sylmar, CA (US); Peter Hebert, Sylmar, CA (US); Dhananjay Bhusari, Sylmar, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 15/223,140

(22) Filed: Jul. 29, 2016

(65) Prior Publication Data
US 2017/0062629 A1 Mar. 2, 2017

Related U.S. Application Data

(62) Division of application No. 14/490,423, filed on Sep. 18, 2014.

(51) Int. Cl.
  *H01L 31/18* (2006.01)
  *H01L 31/0216* (2014.01)
  *H01L 31/0687* (2012.01)

(52) U.S. Cl.
  CPC .... *H01L 31/02168* (2013.01); *H01L 31/0687* (2013.01); *H01L 31/18* (2013.01); *Y02E 10/544* (2013.01)

(58) Field of Classification Search
  CPC ................................................. H01L 31/02168
  See application file for complete search history.

(56) References Cited

U.S. PATENT DOCUMENTS

| 2004/0146723 | A1* | 7/2004 | Mitsuishi | G02B 1/111 |
| | | | | 428/447 |
| 2006/0154392 | A1* | 7/2006 | Tran | H01L 33/22 |
| | | | | 438/22 |
| 2010/0218819 | A1 | 9/2010 | Farmer et al. | |
| 2011/0030778 | A1 | 2/2011 | Takacs et al. | |
| 2011/0100459 | A1 | 5/2011 | Yoon et al. | |
| 2012/0112221 | A1* | 5/2012 | Lai | H01L 33/44 |
| | | | | 257/98 |

(Continued)

OTHER PUBLICATIONS

Aiken, Daniel J., "High Performance Anti-Reflection Coatings for Broadband Multi-Junction Solar Cells," Solar Energy Materials & Solar Cells 64 (2000) 393-404, Albuquerque, NM.

(Continued)

*Primary Examiner* — Bethany L Martin
(74) *Attorney, Agent, or Firm* — Patterson + Sheridan, LLP

(57) ABSTRACT

The present disclosure generally relates to broadband antireflective coatings for reducing reflection of light in the infrared without compromising visible light reflectance in multijunction solar cells bonded to coverglass, and methods of forming the same. The antireflective coatings include a high index, one or more intermediate index, and low index of refraction dielectric layers. The high index dielectric layer utilizes an ion beam assisted deposition to maximize the density and index of refraction. The intermediate index layer(s) increase the bandwidth of the antireflection coating, thereby improving the performance of the antireflective coating in the infrared spectrum.

5 Claims, 4 Drawing Sheets

(56) References Cited

U.S. PATENT DOCUMENTS

2013/0228808 A1* 9/2013 Lester .................... H01L 33/44
257/98
2014/0170308 A1 6/2014 Kalyankar et al.

OTHER PUBLICATIONS

Friedman, D.J., "Progress and Challenges for Next-Generation High-Efficiency Multijunction Solar Cells," Current Opinion in Solid State and Materials Science 14 (2010) 131-138, Golden, Colorado.
Nalwa, Handbook of Surfaces and Interfaces of Materials, 2001, Academic Press, p. 458.
Schubert et al., Nanostructured multilayer graded index antireflection coating for Si solar cells with broadband and omnidirectional characteristics, Applied Physics Letters, 2008.
Refractive Index of Titanium.

* cited by examiner

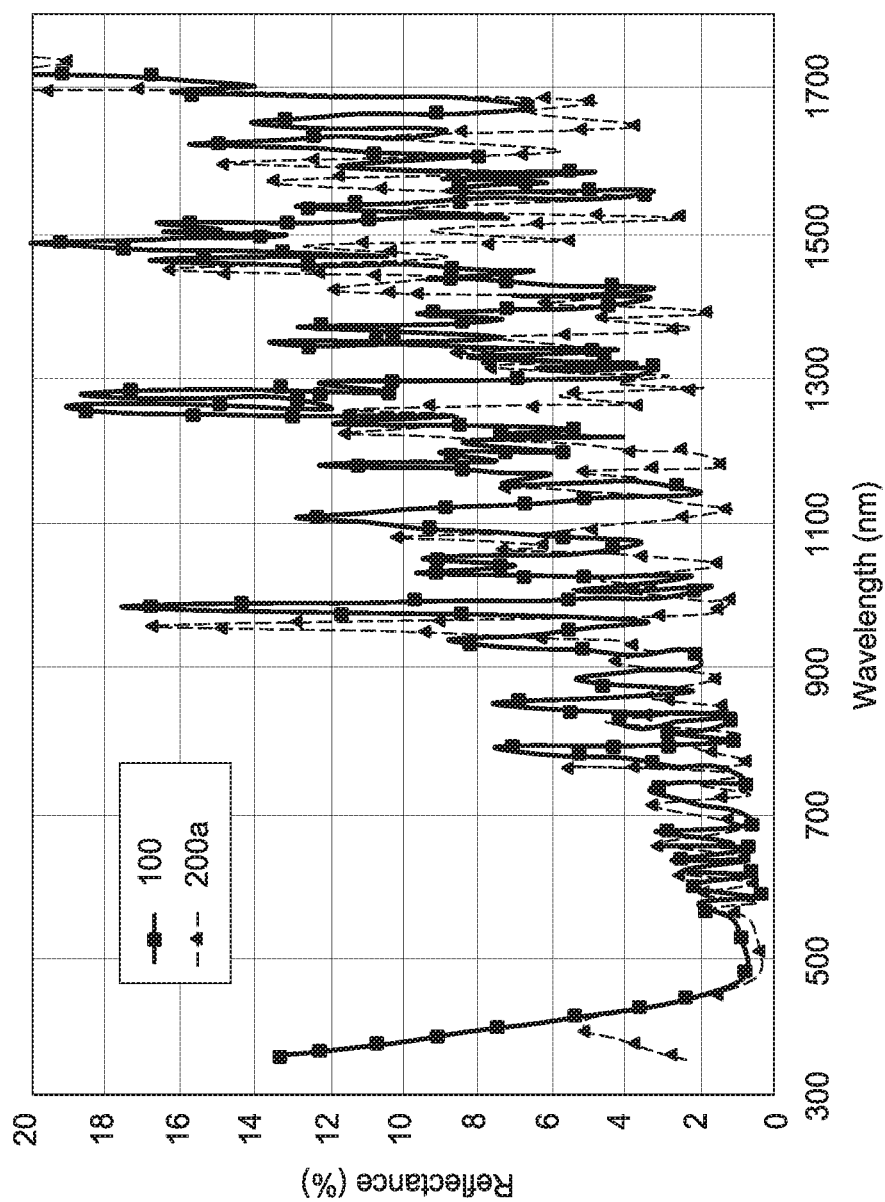

BROADBAND ANTIREFLECTION COATINGS UNDER COVERGLASS USING ION GUN ASSISTED EVAPORATION

CROSS-REFERENCE TO RELATED APPLICATIONS

This application is a divisional application of U.S. patent application Ser. No. 14/490,423, filed Sep. 18, 2014, which is herein incorporated by reference.

GOVERNMENT RIGHTS

This disclosure was made with U.S. government support under DOD Contract No. NRO000-11-C-0599. The U.S. government has certain rights in this disclosure.

BACKGROUND

Field

Aspects of the present disclosure generally relate to solar cells, and more specifically, to antireflective coatings for solar cells.

Description of the Related Art

Solar cells are devices which convert the energy of light directly into electricity via the photovoltaic effect. To enhance the conversion efficiency of solar cells, standard solar cells include antireflective coatings which are designed to suppress reflection in the visible spectrum. However, solar cells having coatings designed for the visible spectrum may experience large reflective losses up to 20 percent for the infrared spectrum. For high efficiency multijunction solar cells without excess current in the infrared, high reflective losses will reduce the efficiency thereof.

Therefore, there is a need for an antireflective coating that reduces reflective losses in the infrared spectrum.

SUMMARY

The present disclosure generally relates to broadband antireflective coatings for reducing reflection between 300-1800 nm for multijunction solar cells into coverglass, and methods of forming the same. The antireflective coatings include three or more dielectric layers that may include aluminum oxide, tantalum oxide, hafnium oxide, yttrium oxide, and titanium oxide. The dielectric layers are deposited by ion beam-assisted evaporation, e-beam evaporation or other deposition methods.

In one aspect, an antireflective coating comprises a first layer having a first index of refraction within a range of about 2.3 to about 2.7; a second layer disposed over the first layer, the second layer having an index of refraction within a range of about 1.8 to about 2.1; and a third layer disposed over the second layer, the third layer having an index of refraction within a range of about 1.6 to about 1.8. In another aspect, the antireflective coating may include a fourth layer disposed between the first layer and the second layer.

In another aspect, a solar cell comprises a multijunction cell and an antireflective coating disposed on the multijunction cell. The antireflective coating comprises a first layer having a first index of refraction within a range of about 2.3 to about 2.7; a second layer disposed over the first layer, the second layer having an index of refraction within a range of about 1.8 to about 2.1; and a third layer disposed over the second layer, the third layer having an index of refraction within a range of about 1.6 to about 1.8. In another aspect, the antireflective coating may include a fourth layer disposed between the first layer and the second layer.

In another aspect, a method of forming an antireflective coating comprises depositing a first layer having a first index of refraction within a range of about 2.3 to about 2.7 on a multijunction cell using ion beam-assisted deposition; depositing a second layer over the first layer, the second layer having an index of refraction within a range of about 1.8 to about 2.1; and depositing a third layer over the second layer, the third layer having an index of refraction within a range of about 1.6 to about 1.8.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, and the disclosure may admit to other equally effective aspects.

FIGS. 3A and 3B are modeled and experimentally measured reflectance spectra, respectively, for antireflective coatings.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure generally relates to broadband antireflective coatings for reducing reflectance loss for multijunction cells into coverglass, and methods of forming the same. The antireflective coatings include a high index dielectric layer, one or more intermediate index layers, and a low index layer. The high index layer is titanium dioxide deposited by ion beam assisted deposition. The intermediate layers have indices of refraction greater than layers disposed on the intermediate layers. The intermediate layers may include tantalum oxide, hafnium oxide, yttrium oxide, and titanium oxide deposited by ion beam-assisted deposition or other deposition methods. A low index layer is disposed over the one or more intermediate index layers.

Figure 1:
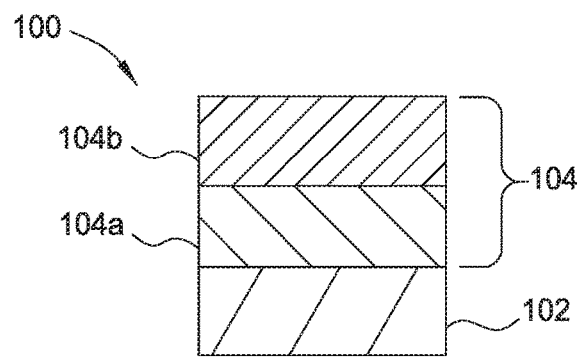
FIG. 1 schematically illustrates a solar cell including a multijunction cell having a conventional antireflective coating disposed thereon.

FIG. 1 illustrates a solar cell 100 including a multijunction cell 102 having a conventional antireflective coating 104 disposed thereon. In one example, the multijunction cell 102 includes a first cell including germanium (Ge), a second cell including gallium arsenide (GaAs) disposed on the first cell, and a third cell including indium gallium phosphide (InGaP) disposed on the second cell. The first, second, and third cells are not shown for clarity. The Ge cell may facilitate absorption of photons within the infrared spectrum, while the GaAs and InGaP cells may facilitate absorption of photons in the visible light spectrum.

An antireflective coating 104 is disposed on the upper surface of the multijunction cell 102. The antireflective coating 104 includes a first layer 104a of titanium oxide ($TiO_2$) deposited using e-beam evaporation, and a second layer 104b of aluminum oxide ($Al_2O_3$) disposed on the first layer 104a and deposited using e-beam evaporation. While the antireflective coating has desirable antireflective properties in the visible light spectrum (e.g., reflective losses less than one percent), the reflective loses in the infrared spectrum may exceed 10 percent or even 20 percent, and therefore, is unsatisfactory.

Figure 2A:
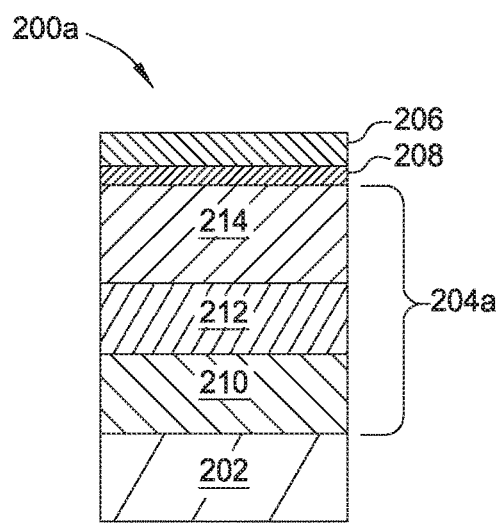
FIGS. 2A and 2B illustrate solar cells including multijunction cells having antireflective coatings disposed thereon, according to aspects of the disclosure.
Figure 2B:
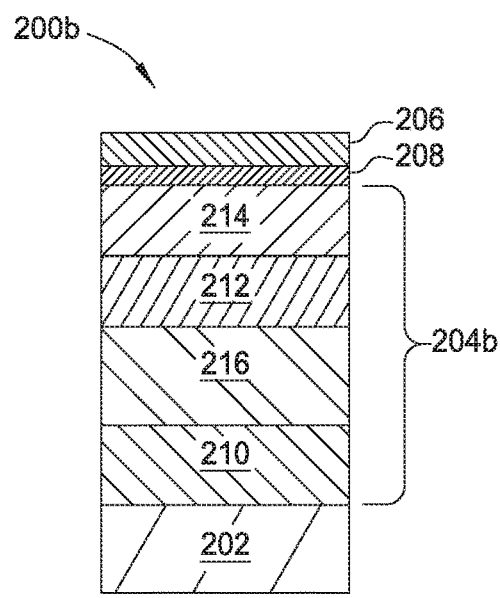

FIGS. 2A and 2B illustrate solar cells 200a, 200b including multijunction cells 202 having antireflective coatings 204a, 204b disposed thereon, according to aspects of the disclosure. The solar cell 200a includes a multijunction cell 202. The multijunction cell 202 may be similar to the multijunction cell 102; however, other multijunction cells and/or single-junction cells are also contemplated. For example, four-junction, five-junction, six-junction or more cells may be utilized. The solar cell 200a includes an antireflective coating 204a disposed thereon. An optional cover glass layer 206 may be positioned over the antireflective coating 204a and secured thereto with an adhesive 208 that is index matched to the glass, such as a polyimide silicone copolymer, to facilitate protection of the antireflective coating 204a and the multijunction cell 202.

The antireflective coating 204 includes a first layer 210, a second layer 212 disposed on the first layer 210, and a third layer 214 disposed on the second layer 212. The first layer 210, e.g., a high index layer, may be a $TiO_2$ layer formed using ion beam-assisted deposition (IBAD). IBAD is a deposition technique which combines ion implantation with simultaneous sputtering or other physical vapor deposition technique. IBAD allows for independent control of parameters such as ion energy, process temperature, and arrival rate of atomic species at the substrate interface during deposition. Additionally, IBAD can be used to form a gradual transition between a substrate material and the deposited film, and to form films with less intrinsic strain. Formation of $TiO_2$ using IBAD results in a $TiO_2$ layer having a higher index of refraction, such as about 2.3 to about 2.7, for example about 2.4 to about 2.5, compared to $TiO_2$ formed by other methods, which may have an index of refraction of about 2.2.

A second layer 212, e.g., a first intermediate layer, is disposed on the upper surface of the first layer 210. The second layer 212 may be a tantalum oxide ($Ta_2O_5$) layer having an index of refraction of about 1.8 to about 2.1, such as about 2.0. Other materials, including hafnium oxide ($HfO_2$) and yttrium oxide ($YtO_2$), also having indices of refraction of about 1.8 to about 2.1, may also be used. The second layer 212 may be deposited using e-beam evaporation chambers; however, other deposition methods are also contemplated. A third layer 214, e.g., a low index layer, for example $Al_2O_3$ deposited by e-beam deposition, may be disposed on the upper surface of the second layer 212. The third layer 214 has an index of refraction of about 1.6 to about 1.8, such as about 1.7. In one example, the first layer 210 may have a thickness within a range of about 20 nanometers to about 60 nanometers, such as about 30 nanometers to about 50 nanometers; the second layer 212 may have a thickness of about 1 nanometer to about 50 nanometers, such as about 30 nanometers to about 50 nanometers; and the third layer may have a thickness within a range of about 50 nanometers to about 100 nanometers, such as about 70 nanometers to about 90 nanometers. Other thicknesses, however, are also contemplated.

In comparison to the device of FIG. 1, the inclusion of the second layer 212, e.g., the intermediate layer, reduces the magnitude of difference between indices of refraction of adjacent layers of the antireflective coating 204a. Stated otherwise, the difference between the indices of refraction of adjacent layers of antireflective coatings of the present disclosure is less than the difference between the indices of refraction of adjacent layers of conventional antireflective layers. Intermediate layers increase the number of minima in the reflectance spectra, thereby increasing the bandwidth of the anti-reflection coating. The increase in bandwidth of the AR coating reduces the infrared reflectance. Typically the addition of these intermediate layers is accompanied by an unwanted increase in visible reflectance. However, the visible light reflectance that accompanies the utilization of the second layer 212 can be suppressed by using a high index dielectric layer 210 to with an index as close to the index of refraction of the multijunction cell 202 as possible. In one example, the multijunction cell 202 may have an index of refraction of about 3.0. An increase in the index of refraction for layer 210 can be accomplished by forming the layer using IBAD techniques, which serves to densify and increase the index of refraction of the first layer 210.

FIG. 2B illustrates a solar cell 200b including a multijunction cell 202 having an antireflective coating 204b thereon, according to an aspect of the disclosure. The solar cell 200b is similar to solar cell 200a; however, solar cell 200b includes a fourth layer 216 (e.g., a second intermediate layer) disposed between the first layer 210 and the second layer 212. The fourth layer 216 may be a $TiO_2$ layer formed using a deposition method other than IBAD, such as e-beam evaporation, and thus, has an index of refraction between that of the first layer 210 and the second layer 212, further suppressing infrared reflectance by reducing the relative difference between indices of refraction of adjacent layers. In such an example, the fourth layer 216 may have an index of refraction of about 2.2. Additionally, while the fourth layer 216 may be formed of the same material as the first layer 210 (e.g., $TiO_2$), the fourth layer 216 is formed using a deposition method different than the first layer 210, thereby resulting in a different index of refraction than the first layer 210. Thus, similar materials can be utilized for different layers of the antireflective coatings of the present disclosure, thereby simplifying source material procurement and storage, while still allowing for differences in indices of refraction.

In another example, the first layer 210 may have a thickness within a range of about 20 nanometers to about 60 nanometers, such as about 30 nanometers to about 40 nanometers; the fourth layer 216 may have a thickness within a range of about 20 nanometers to about 60 nanometers, such as about 20 nanometers to about 40 nanometers; the second layer 212 may have a thickness of about 1 nanometer to about 50 nanometers, such as about 30 nanometers to about 50 nanometers; and the third layer 214 may have a thickness within a range of about 50 nanometers to about 100 nanometers, such as about 70 nanometers to about 90 nanometers.

Figure 3A:
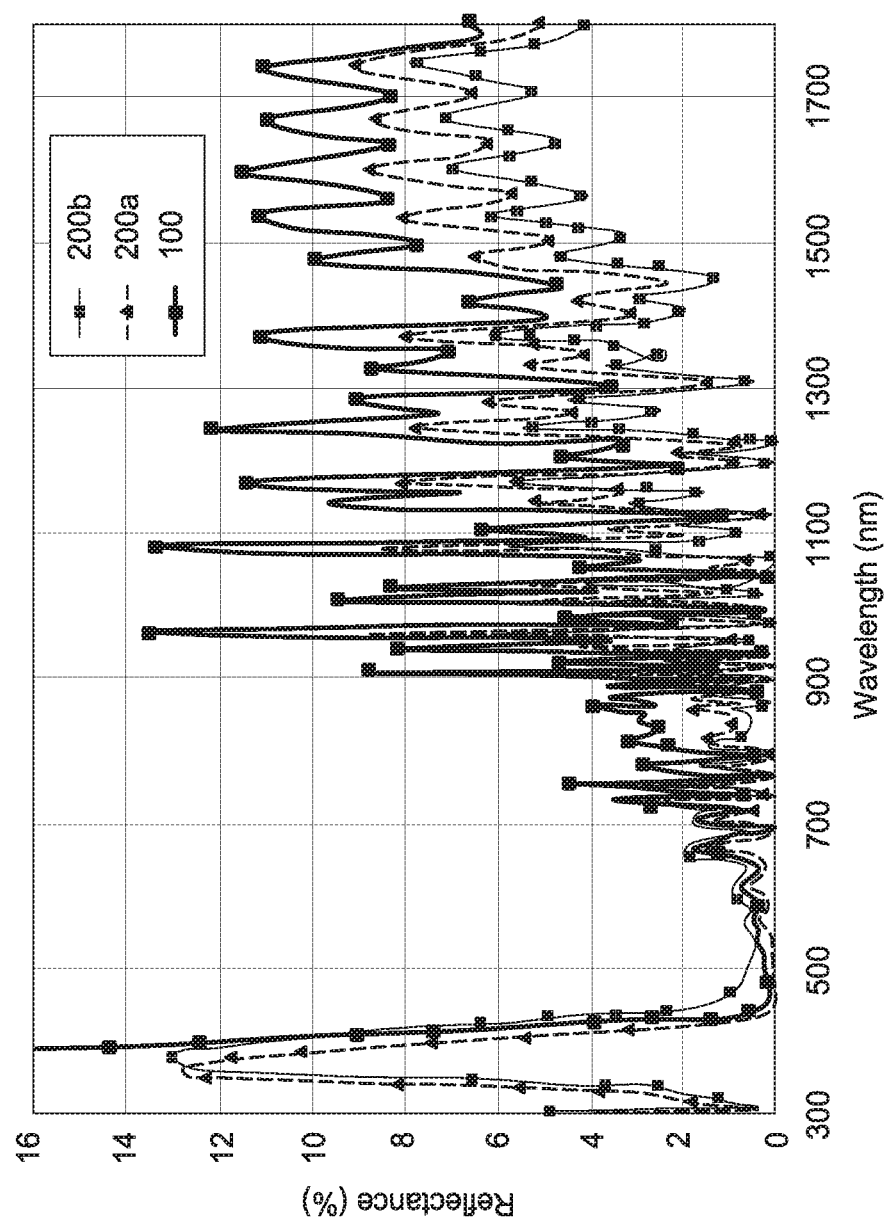

FIGS. 3A and 3B are graphs illustrating percent reflectance for antireflective coatings. FIG. 3A illustrates modeled percent reflectance of the solar cells 100, 200a, and 200b, respectively. As illustrated in FIG. 3A, the solar cell 100 has an average reflectance of about 10 percent in the infrared region of the spectrum. In comparison, the solar cell 200a has an average reflectance of about 7 percent in the infrared region, while the solar cell 200b has an average reflectance of about 5 to about 5.5 percent in the infrared region. Thus, aspects of the present disclosure provide significant improvements in suppression of infrared reflection compared to previously known antireflective coatings, without increasing reflectance losses in the visible spectrum.

FIG. 3B illustrates a graph of experimentally-determined wavelength versus percent reflectance for the solar cells 100 and 200a. As explained above, the solar cell 200a utilizes an intermediate layer, for example second layer 212, formed of $Ta_2O_5$, to decrease reflectance losses in the infrared spectrum. As illustrated in FIG. 3B, the experimental data of FIG. 3B supports the modeled data of FIG. 3A.

Figure 4A:
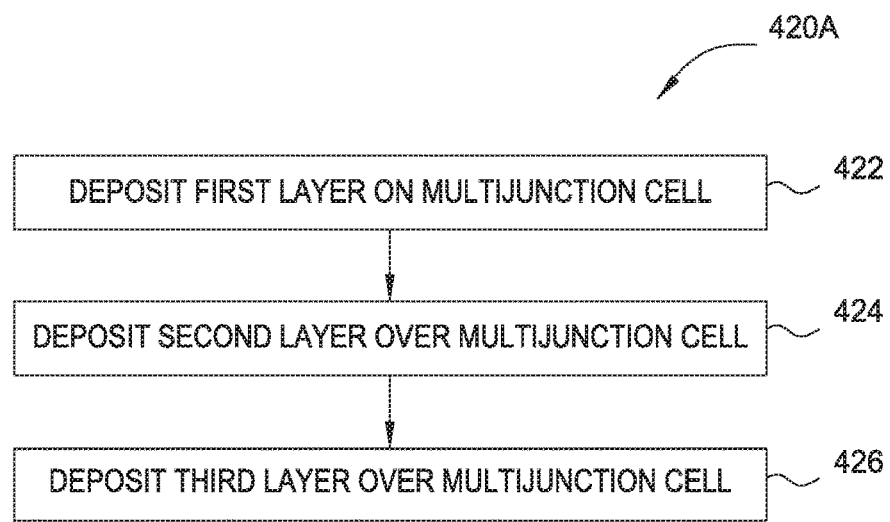
FIGS. 4A and 4B are flow diagrams of methods for forming an antireflective coating, according to one aspect of the disclosure.

FIG. 4A illustrates a flow diagram of a method 420a forming an antireflective coating, according to one aspect of the disclosure. The method 420A begins at operation 422 in which a first layer, such as the first layer 210 described above, is deposited over a multijunction cell, such as multijunction cell 202 shown in FIG. 2A. The first layer 210 may include, for example, IBAD evaporated $TiO_2$. Subsequently, in operation 424, a second layer, such as the second layer 212 described above, is deposited over the multijunction cell, for example on the first layer 210. The second layer 212 may be deposited using e-beam evaporation, or other deposition techniques including atomic layer deposition (ALD), plasma-enhanced ALD, chemical vapor deposition (CVD), plasma-enhanced CVD, or sputtering. The second layer 212 may include, for example, $Ta_2O_5$, $HfO_2$, or $YtO_2$. The second layer 212 generally has an index of refraction less than the first layer 210.

In operation 426, a third layer, such as the third layer 214 described above, is deposited over the multijunction cell, for example on the second layer 212. The third layer 214 may be deposited using e-beam evaporation, or other deposition techniques including ALD, plasma-enhanced ALD, CVD, plasma-enhanced CVD, or sputtering. The third layer 214 is formed from, for example, $Al_2O_3$. The third layer 214 generally has an index of refraction less than the second layer 212. In one aspect, the first layer 210, the second layer 212, and the third layer 214 may be deposited in a single process run at a rate of about 5 angstroms per second.

Figure 4B:
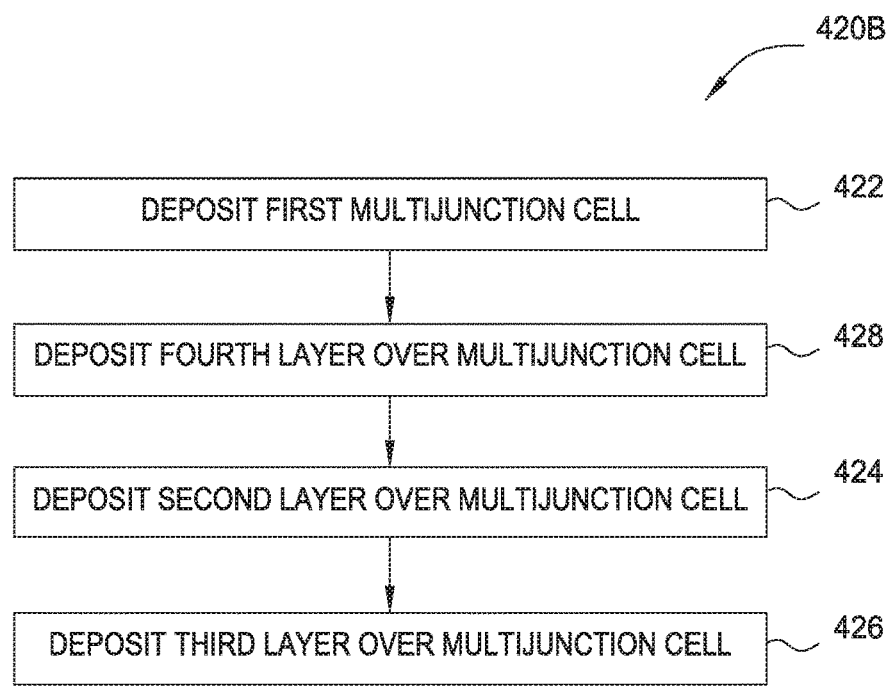

FIG. 4B illustrates a flow diagram of a method 420b of forming an antireflective coating according to another aspect of the disclosure. Method 420b is similar to method 420a; however, method 420b includes an additional operation 428 subsequent to operation 422 and prior to operation 424. In operation 428, a fourth layer 216 (e.g., and additional intermediate layer), is deposited over the multijunction cell, for example, on the first layer 210. The fourth layer 216 may include $TiO_2$ and be deposited by e-beam evaporation. Other deposition techniques, including ALD, plasma-enhanced ALD, CVD, plasma-enhanced CVD, or sputtering, are also contemplated. The fourth layer 216 generally has an index of refraction less than the first layer 210, but greater than the second layer 212. The inclusion of the fourth layer 216 further reduces infrared reflectance.

Benefits of the disclosure include increased suppression of reflection within the infrared spectrum, without sacrificing reflection suppression in the visible light spectrum. While aspects herein are described with respect to three layer and four layer antireflective coatings, it is contemplated that antireflective coatings may include more than four layers to further facilitate incremental reduction of indices of refraction between adjacent antireflective coating layers.

While the foregoing is directed to aspects of the present disclosure, other and further aspects of the disclosure may be devised without departing from the basic scope thereof, and the scope thereof is determined by the claims that follow.

What is claimed is:

1. A method of forming an antireflective coating, comprising:
   depositing a first layer comprising titanium dioxide and having a first index of refraction within a range of about 2.3 to about 2.7 using ion beam-assisted deposition;
   depositing an intermediate layer by e-beam evaporation comprising titanium dioxide on the first layer, the intermediate layer having an index of refraction and a density less than the first layer;
   depositing a second layer on the intermediate layer by e-beam evaporation, the second layer having an index of refraction less than the intermediate layer and within a range of about 1.8 to about 2.1; and
   depositing a third layer on the second layer, the third layer having an index of refraction within a range of about 1.6 to about 1.8.

2. The method of claim 1, wherein the third layer comprises aluminum oxide.

3. The method of claim 1, wherein the first layer has a thickness within a range of about 20 nanometers to about 60 nanometers.

4. The method of claim 1, wherein the second layer has a thickness of about 1 nanometer to about 50 nanometers.

5. A method for forming a solar cell, comprising:
   depositing a first layer comprising titanium dioxide on the solar cell using ion beam-assisted deposition, the first layer having a first index of refraction within a range of about 2.3 to about 2.7;
   depositing an intermediate layer using e-beam assisted deposition, the intermediate layer comprising titanium dioxide disposed on the first layer, the intermediate layer having an index of refraction and a density less than the first layer;
   depositing a second layer disposed on the intermediate layer, the second layer comprising tantalum oxide and having an index of refraction less than the intermediate layer and within a range of about 1.8 to about 2.1; and
   depositing a third layer disposed on the second layer, the third layer comprising aluminum oxide and having an index of refraction within a range of about 1.6 to about 1.8.

* * * * *